United States Patent
Dar

(10) Patent No.: US 9,530,516 B2
(45) Date of Patent: *Dec. 27, 2016

(54) READOUT OF INTERFERING MEMORY CELLS USING ESTIMATED INTERFERENCE TO OTHER MEMORY CELLS

(71) Applicant: Apple Inc., Cupertino, CA (US)

(72) Inventor: Ronen Dar, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/823,033

(22) Filed: Aug. 11, 2015

(65) Prior Publication Data

US 2015/0348644 A1 Dec. 3, 2015

Related U.S. Application Data

(63) Continuation of application No. 13/771,370, filed on Feb. 20, 2013, now Pat. No. 9,135,972.

(51) Int. Cl.
| | | |
|---|---|---|
| *G11C 16/34* | (2006.01) | |
| *G06F 11/10* | (2006.01) | |
| *G06F 12/02* | (2006.01) | |
| *G11C 11/00* | (2006.01) | |
| *G11C 11/56* | (2006.01) | |
| *G11C 16/26* | (2006.01) | |
| *G11C 29/52* | (2006.01) | |

(52) U.S. Cl.
CPC ....... *G11C 16/3427* (2013.01); *G06F 11/1068* (2013.01); *G06F 12/0246* (2013.01); *G11C 11/00* (2013.01); *G11C 11/5642* (2013.01); *G11C 16/26* (2013.01); *G11C 16/3422* (2013.01); *G11C 16/3431* (2013.01); *G11C 29/52* (2013.01); *G06F 11/1048* (2013.01)

(58) Field of Classification Search
None
See application file for complete search history.

(56) References Cited

U.S. PATENT DOCUMENTS

| | | |
|---|---|---|
| 8,060,806 B2 | 11/2011 | Shalvi et al. |
| 8,156,403 B2 | 4/2012 | Shalvi et al. |
| 8,743,616 B1 | 6/2014 | Wu et al. |
| 8,871,651 B1 | 10/2014 | Choi et al. |
| 2006/0221683 A1 | 10/2006 | Chen et al. |
| 2008/0077841 A1 | 3/2008 | Gonzalez et al. |
| 2009/0158126 A1* | 6/2009 | Perlmutter .......... G06F 11/1072 714/773 |
| 2012/0137067 A1 | 5/2012 | Lee et al. |
| 2013/0051141 A1 | 2/2013 | Moschiano et al. |
| 2013/0070524 A1 | 3/2013 | Dutta et al. |

\* cited by examiner

*Primary Examiner* — Edward Dudek, Jr.
*Assistant Examiner* — Ralph A Verderamo, III
(74) *Attorney, Agent, or Firm* — Meyertons, Hood, Kivlin, Kowert & Goetzel, P.C.

(57) ABSTRACT

A method includes storing data in a memory that includes multiple analog memory cells. After storing the data, an interference caused by a first group of the analog memory cells to a second group of the analog memory cells is estimated. The data stored in the first group is reconstructed based on the estimated interference caused by the first group to the second group.

20 Claims, 2 Drawing Sheets

READOUT OF INTERFERING MEMORY CELLS USING ESTIMATED INTERFERENCE TO OTHER MEMORY CELLS

PRIORITY INFORMATION

This application claims priority to U.S. Provisional Patent Application Ser. No. 13/771,370, entitled "READOUT OF INTERFERING MEMORY CELLS USING ESTIMATED INTERFERENCE TO OTHER MEMORY CELLS," filed Feb. 20, 2013, which is hereby incorporated by reference in its entirety as though fully and completely set forth herein.

TECHNICAL FIELD

Embodiments disclosed herein relate generally to data storage, and particularly to methods and systems for reading data from analog memory cells.

BACKGROUND

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

In many practical memory devices, analog memory cells cause interference to one another, for example due to electrical field coupling among the memory cells. Various techniques are known in the art for canceling such interference. For example, U.S. Pat. No. 8,156,403, whose disclosure is incorporated herein by reference, describes a method for operating a memory device. The method includes encoding data using an Error Correction Code (ECC) and storing the encoded data as first analog values in respective analog memory cells of the memory device. After storing the encoded data, second analog values are read from the respective memory cells of the memory device in which the encoded data were stored. At least some of the second analog values differ from the respective first analog values. A distortion that is present in the second analog values is estimated. Error correction metrics are computed with respect to the second analog values responsively to the estimated distortion. The second analog values are processed using the error correction metrics in an ECC decoding process, so as to reconstruct the data.

SUMMARY OF THE EMBODIMENTS

An embodiment that is described herein provides a method including storing data in a memory that includes multiple analog memory cells. After storing the data, an interference caused by a first group of the analog memory cells to a second group of the analog memory cells is estimated. The data stored in the first group is reconstructed based on the estimated interference caused by the first group to the second group.

In some embodiments, storing the data includes writing respective analog values into the analog memory cells, and estimating the interference includes estimating an electrical-field cross-coupling between one or more of the analog memory cells in the first group and one or more of the analog memory cells in the second group. In an embodiment, reconstructing the data includes modifying, based on the estimated interference, respective likelihoods of the memory cells in the first group holding respective values of the data.

In another embodiment, reconstructing the data includes calculating, based on the estimated interference, one or more read thresholds for reading the analog memory cells in the first group. In yet another embodiment, reconstructing the data includes calculating, based on the estimated interference, soft decoding metrics for reading the analog memory cells in the first group.

In a disclosed embodiment, storing the data includes writing respective analog values into the analog memory cells, and estimating the interference includes estimating offsets of the analog values, which occur in one or more of the memory cells in the second group due to the interference. In an example embodiment, the first and second groups are associated with respective first and second word lines of the memory. In an embodiment, estimating the interference includes assessing a first plurality of interference levels, caused by a second respective plurality of memory cells in the first group to a third respective plurality of memory cells in the second group.

There is additionally provided, in accordance with an embodiment, apparatus including an interface and storage circuitry. The interface is configured for communicating with a memory that includes multiple analog memory cells. The storage circuitry is configured to store data in the analog memory cells of the memory, to estimate, after storing the data, an interference caused by a first group of the analog memory cells to a second group of the analog memory cells, and to reconstruct the data stored in the first group based on the estimated interference caused by the first group to the second group.

There is also provided, in accordance with an embodiment, apparatus including a memory and storage circuitry. The memory includes multiple analog memory cells. The storage circuitry is configured to store data in the analog memory cells of the memory, to estimate, after storing the data, an interference caused by a first group of the analog memory cells to a second group of the analog memory cells, and to reconstruct the data stored in the first group based on the estimated interference caused by the first group to the second group.

The embodiments disclosed herein will be more fully understood from the following detailed description thereof, taken together with the drawings in which:

DETAILED DESCRIPTION OF EMBODIMENTS

Overview

Figure 1:
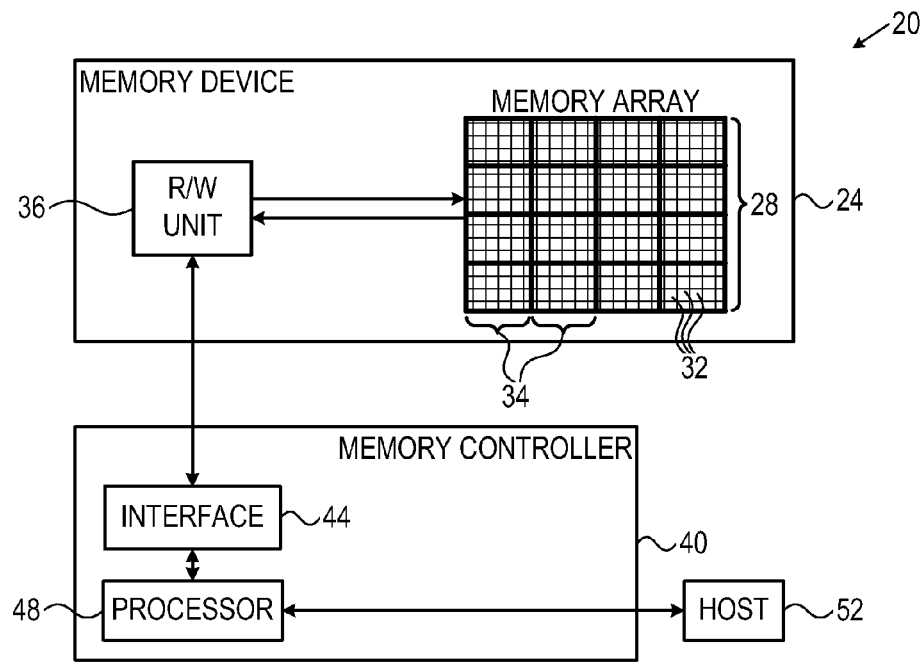
FIG. 1 is a block diagram that schematically illustrates a memory system, in accordance with an embodiment.

Embodiments that are described herein provide improved methods and systems for reading and decoding data stored in analog memory cells. The disclosed techniques improve the performance of data readout from a first group of memory cells, by using information regarding the interference that is caused by the first group to a second group of memory cells.

In some embodiments, a memory controller stores data on behalf of a host in a memory that includes multiple analog memory cells, such as Flash cells. The data is stored in the analog memory cells by writing respective analog values into the cells. The analog memory cells of the memory are arranged in rows associated with word lines. In most practical memory devices, the memory cells in a given word line cause interference in the memory cells of one or more neighboring word lines, for example due to electrical-field cross-coupling among the memory cells.

Conventional wisdom views the above-described interference as an undesirable effect that degrades readout performance and should therefore be mitigated. In the disclosed techniques, by contrast, the interference is viewed as an additional source of information that can be exploited for improving the readout of the interfering memory cells. In other words, instead of (or in addition to) using interference estimation to cancel the interference in the interfered cells, the disclosed techniques use interference estimation for improving readout performance from the interfering cells.

Consider, for example, a target word line from which data is to be read, and a neighboring word line that is subject to interference from the target word line. In this example, each memory cell in the target word line causes interference to a corresponding memory cell in the neighboring word line. Typically, the level of interference in the interfered cell is directly related to the magnitude of the analog value stored in the interfering cell. Therefore, the level of interference in the interfered cell (in the neighboring word line) can be used as an indication of the analog value in the interfering cell (in the target word line): Strong interference is typically caused by large analog values, and vice versa.

Thus, in some embodiments the memory controller estimates respective interference levels in the memory cells of the neighboring word line, and uses the estimated interference levels to improve the readout of the corresponding memory cells in the target word line. For example, the interference levels in the neighboring word line can be used for setting read thresholds for reading the analog values of the target word line. Alternatively, the interference levels in the neighboring word line can be used for adjusting soft decoding metrics (e.g., Log Likelihood Ratios—LLRs) for soft-decoding the analog values of the target word line.

In summary, the methods and systems described herein read data from analog memory cells, while utilizing the interference inflicted by these analog memory cells to other analog memory cells. As a result, data readout performance is improved.

System Description

FIG. 1 is a block diagram that schematically illustrates a memory system 20, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles embodiments, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In some embodiments, the memory cells of a given bit line are divided into groups that are referred to as strings. The memory cells in each string are connected source-to-drain in series with one another, between the bit line and ground. Each string can typically be connected and disconnected individually to the bit line.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes techniques for reading data from memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
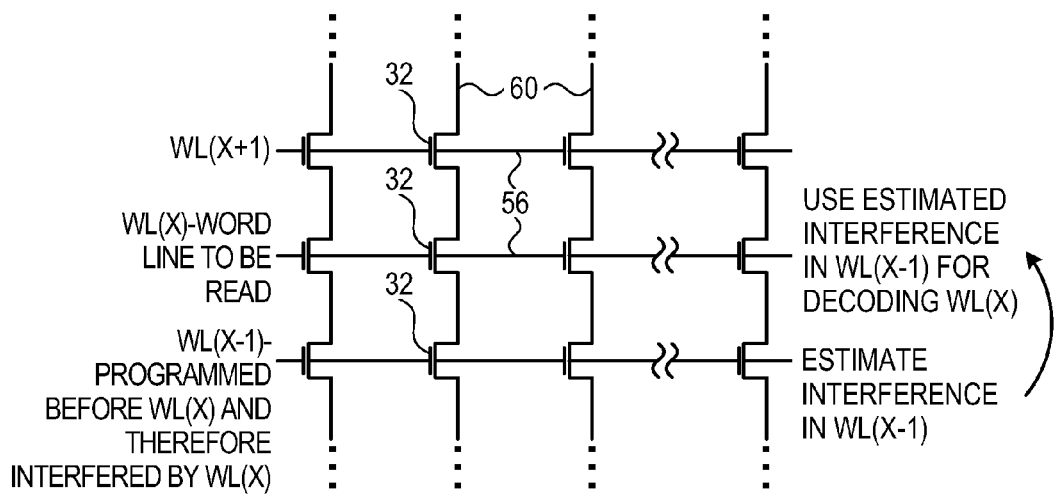
FIG. 2 is a diagram that schematically illustrates a process for reading a target word line using interference caused to another word line, in accordance with an embodiment.

Reading Data from Target Word Line Using Interference Estimation in Neighboring Word Line FIG. 2 is a diagram that schematically illustrates a process for reading a target word line using interference caused to another word line, in accordance with an embodiment. The figure shows three word lines denoted WL(X−1), WL(X) and WL(X+1), which are part of a memory block 34 that comprises multiple word lines. Each word line comprises multiple memory cells 32.

In the present example, processor 48 of memory controller 40 programs the memory sequentially, in ascending order of the word lines. In other words, the memory controller stores data in WL(X−1), then in WL(X) and then in WL(X+1). Data storage in a given word line is performed using an iterative Programming and Verification (P&V) process. This sort of programming inherently compensates for interference that is present at the time of programming. Therefore, a given word line is subjected only to interference from the subsequent word line (which is programmed later) and not from the preceding word line (which was already programmed at the time the given word line was programmed).

In the embodiment of FIG. 2, processor 48 reconstructs the data stored in the memory cells of WL(X) by:

Estimating the levels of interference in the memory cells of WL(X−1), after reading or even decoding the data stored in the memory cells of WL(X−1). (As explained above, the interference in WL(X−1) can be assumed to be caused only by WL(X).)

Reading the analog values and decoding the data from WL(X) based on the estimated interference levels in WL(X−1). In addition, processor 48 may also read and possibly decode WL(X+1) to improve the decoding of WL(X).

Processor 48 can use the estimated interference levels in WL(X−1) in various ways to improve data reconstruction from WL(X). For example, assume that memory cells 32 are Single-Level Cells (SLC), each storing a single data bit. Assume also, without loss of generality that logical "0" is stored in a memory cell by writing a high analog value into the cell, and logical "1" is stored in a memory cell by writing a low analog value.

In this example, if a given memory cell in WL(X) is programmed with "0" (large analog value) then the interference level in the corresponding cell in WL(X−1) will be high. If, on the other hand, the given memory cell in WL(X) is programmed with "1" (small analog value), the interference level in the corresponding cell in WL(X−1) will be low.

Therefore, upon identifying strong interference in a given memory cell in WL(X−1), processor 48 typically increases the likelihood that the corresponding cell in WL(X) stores "0". Upon identifying little or no interference in a given memory cell in WL(X−1), processor typically increases the likelihood that the corresponding cell in WL(X) stores "1".

Processor 48 may use the estimated interference levels in WL(X−1) in various ways in order to decode the data from WL(X). In some embodiments, processor 48 reads the data from WL(X) by sensing the analog values of the memory cells of WL(X) using one or more read thresholds. In these embodiments, processor 48 may adjust the read thresholds depending on the interference levels in WL(X−1).

For example, if the interference in a given cell in WL(X−1) is strong, indicating that the corresponding cell in WL(X) is likely to hold "0", then processor 48 may read the cell in WL(X) using a read threshold that is slightly lower than its nominal value. As a result, the likelihood of detecting "0" will increase. Similarly, if the interference in a given cell in WL(X−1) is weak, indicating that the corresponding cell in WL(X) is likely to hold "1", then processor 48 may read the cell in WL(X) using a read threshold that is slightly higher than the nominal value. As a result, the likelihood of detecting "1" will increase. The offset applied to the read threshold may be calculated depending on the interference level in the corresponding cell in WL(X−1).

As another example, in some embodiments processor 48 reconstructs the data from the readout results of WL(X) in a soft decoding process. In such a process, for each readout result from a cell in WL(X), processor 48 calculates a respective soft decoding metric that indicates the likelihood of that cell to hold "1" or "0". The soft decoding metrics may comprise, for example, LLRs. The data stored in WL(X) may be encoded with an Error Correction Code (ECC), in which case processor 48 decodes the ECC using the soft decoding metrics.

In these embodiments, processor 48 may adjust the soft decoding metrics of the logical values stored in WL(X) based on the respective interference levels in the corresponding memory cells of WL(X−1). When processor 48 decodes the ECC in an iterative decoding process, the LLRs in questions may comprise the initial LLRs provided to the ECC decoder.

In alternative embodiments, processor 48 may use the estimated interference levels of the cells in WL(X−1) in any other way to read the memory cells of WL(X) with improved performance.

Figure 3:
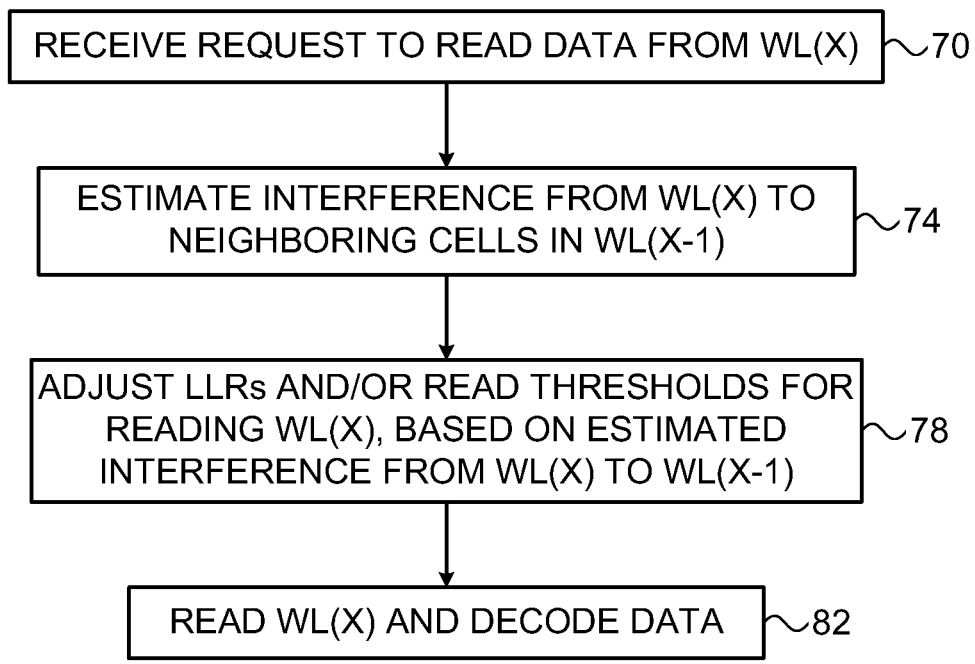
FIG. 3 is a flow chart that schematically illustrates a method for reading a target word line using interference caused to another word line, in accordance with an embodiment.

FIG. 3 is a flow chart that schematically illustrates a method for reading a target word line using interference caused to another word line, in accordance with an embodiment. The method begins with memory controller 40 receiving a request to read data that is stored in WL(X), at a request reception step 70.

Processor 48 in memory controller 40 estimates the interference levels in the memory cells of WL(X−1), at an interference estimation step 74. Processor 48 adjusts the read thresholds and/or the LLRs that are used for reading and decoding the data of WL(X), based on the estimated interference levels of WL(X−1), at an adjustment step 78. Processor 48 reads and decodes the data from WL(X) using the adjusted read thresholds and/or the LLRs, at a readout step 82.

In various embodiments, processor 48 may estimate the levels of interference in the analog values of WL(X−1) in any suitable way. For example, processor 48 may read (and even decode) WL(X−1) and estimate the deviations of the read analog values from the nominal expected values. A large positive deviation in a given analog value is typically indicative of strong interference from the corresponding cell in WL(X), and vice versa.

In some embodiments, processor 48 uses the interference estimation in WL(X−1) for decoding WL(X) using the disclosed techniques, and also for canceling the interference in WL(X−1). Additionally or alternatively, processor 48 may use the same readout operation from WL(X−1) for retrieving the data that is stored in WL(X−1), and also for estimating the interference in WL(X−1) for performing the disclosed techniques. In these embodiments, the disclosed techniques do not incur additional read operations.

In some embodiments, processor 48 reads WL(X) in order to improve the decoding of WL(X−1). In these embodiments, processor 48 may also decode the data of WL(X) without additional read operations, by using the estimated interference in WL(X−1) to carry out the disclosed techniques. Alternatively, processor 48 may initially decode WL(X) using the disclosed techniques, and then, without any additional read operations, decode the data of WL(X−1) (possibly exploiting estimated interference from WL(X)).

The embodiments described herein refer mainly to Single Level Cells (SLC). In alternative embodiments, the disclosed techniques can also be used, mutatis mutandis, with Multi-Level Cells (MLC) that store more than one bit per cell.

In the disclosed embodiments, each memory cell inflicts interference on a single memory cell in the preceding word line. This choice, however, is made purely for the sake of conceptual clarity. In alternative embodiments, the disclosed techniques can be used with any other suitable interference model, e.g., with models in which a memory cell may inflict interference on multiple other memory cells, possibly in more than one word line.

Generally, the disclosed techniques can be used for reconstructing data from any given group of memory cells based on the interference inflicted by the given group on one or more other memory cells. For example, a given word line may store one page in the odd-order memory cells and another page in the even-order memory cells. In such an implementation, the disclosed techniques can be used for reading and decoding data from one of these pages based on the interference inflicted by the other page. This interference is sometimes referred to as horizontal cross-talk.

The embodiments described herein refer mainly to a sequential programming order in ascending order of word lines, and to a P&V programming process that compensates for interference that is present at the time of programming. In alternative embodiments, the disclosed techniques can be used with any other suitable programming order and with any other suitable programming process.

It will thus be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a plurality of memory cells;
circuitry configured to:
receive a request to read a first group of the plurality of memory cells;
estimate interference from the first group of the plurality of memory cells to a second group of the plurality of memory cells;
adjust one or more read settings dependent upon the interference; and
read the first group of the plurality of memory cells using the adjusted read settings.

2. The apparatus of claim 1, wherein each memory cell of the first group of the plurality of memory cells is coupled to a first word line, and wherein each memory cell of the second group of the plurality of memory cells is coupled to a second word line.

3. The apparatus of claim 1, wherein to adjust the one or more read settings, the circuitry is further configured to adjust one or read threshold values dependent upon the interference.

4. The apparatus of claim 1, wherein to adjust the one or more read settings, the circuitry is further configured to modify at least one soft decoding metric of a logical value stored in a corresponding memory cell dependent upon the interference.

5. The apparatus of claim 4, wherein data stored in the first group of the plurality of memory cells is encoded with an Error Correction Code (ECC), and wherein to read the first group of memory cells, the circuitry is further configured to decode the ECC dependent upon the at least one soft decoding metric.

6. The apparatus of claim 1, wherein each memory cell of the plurality of memory cells comprises a non-volatile memory cell.

7. A method, comprising:
receiving a request to read a first group of a plurality of memory cells;
estimating interference from the first group of the plurality of memory cells to a second group of the plurality of memory cells;
adjusting one or more read settings dependent upon the interference; and
reading the first group of the plurality of memory cells using the adjusted read settings.

8. The method of claim 7, wherein each memory cell of the first group of the plurality of memory cells is coupled to a first word line, and wherein each memory cell of the second group of the plurality of memory cells is coupled to a second word line.

9. The method of claim 7, wherein adjusting the one or more read settings comprises adjusting one or read threshold values dependent upon the interference.

10. The method of claim 7, wherein adjusting the one or more read settings comprises modifying at least one soft decoding metric of a logical value stored in a corresponding memory cell dependent upon the interference.

11. The method of claim 10, wherein data stored in the first group of the plurality of memory cells is encoded with an Error Correction Code (ECC), and wherein reading the first group of memory cells comprises decoding the ECC dependent upon the at least one soft decoding metric.

12. The method of claim 7, wherein estimating the interference from the first group of the plurality of memory cells to the second group of the plurality of memory cells includes determining a logical value stored in at least one memory cell of the second group of the plurality of memory cells.

13. The method of claim 7, wherein each memory cell of the plurality of memory cells comprises a non-volatile memory cell.

14. A system, comprising:
a host;
a memory device including a plurality of memory cells, wherein the memory device is configured to:
receive a request to read a first group of the plurality of memory cells;
estimate interference from the first group of the plurality of memory cells to a second group of the plurality of memory cells;
adjust one or more read settings dependent upon the interference; and
read the first group of the plurality of memory cells using the adjusted read settings.

15. The system of claim 14, wherein each memory cell of the first group of the plurality of memory cells is coupled to a first word line, and wherein each memory cell of the second group of the plurality of memory cells is coupled to a second word line.

16. The system of claim 14, wherein to adjust the one or more read settings, the memory device is further configured to adjust one or read threshold values dependent upon the interference.

17. The system of claim 14, wherein to adjust the one or more read settings, the memory device is further configured to modify at least one soft decoding metric of a logical value stored in a corresponding memory cell dependent upon the interference.

18. The system of claim 17, wherein data stored in the first group of the plurality of memory cells is encoded with an Error Correction Code (ECC), and wherein to read the first group of memory cells, the memory device is further configured to decode the ECC dependent upon the at least one soft decoding metric.

19. The system of claim 14, wherein to estimate the interference from the first group of the plurality of memory cells to the second group of the plurality of memory cells, the memory device is further configured to determine a logical value stored in at least one memory cell of the second group of the plurality of memory cells.

20. The system of claim 14, wherein each memory cell of the plurality of memory cells comprises a non-volatile memory cell.

* * * * *